United States Patent
Anand et al.

(10) Patent No.: US 9,293,824 B2
(45) Date of Patent: Mar. 22, 2016

(54) INTERCHANGEABLE PRINTED CIRCUIT BOARD AMONG VARIOUS TYPES OF PLATFORMS BY ADJUSTING AN IMPEDANCE VALUE

(71) Applicant: Hewlett-Packard Development Company, L.P., Houston, TX (US)

(72) Inventors: Rajat Sandeshkumar Anand, Fremont, CA (US); Jean G Atallah, Fremont, CA (US); Samuel H Chau, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 521 days.

(21) Appl. No.: 13/689,698

(22) Filed: Nov. 29, 2012

(65) Prior Publication Data

US 2014/0145901 A1 May 29, 2014

(51) Int. Cl.
*H01Q 1/50* (2006.01)
*H01Q 7/00* (2006.01)
*H03H 7/40* (2006.01)
*H05K 1/02* (2006.01)

(52) U.S. Cl.
CPC . *H01Q 7/00* (2013.01); *H03H 7/40* (2013.01); *H05K 1/025* (2013.01); *H05K 2201/10098* (2013.01); *H05K 2203/171* (2013.01); *Y10T 29/49018* (2015.01)

(58) Field of Classification Search
CPC .......... H03H 7/40; H01Q 7/00; H05K 1/025; H05K 2203/171; H05K 2201/10098; Y10T 29/49018
See application file for complete search history.

(56) References Cited

U.S. PATENT DOCUMENTS

| | | | |
|---|---|---|---|
| 2007/0072647 A1* | 3/2007 | Mousseau | G06F 3/0237 455/564 |
| 2009/0231220 A1* | 9/2009 | Zhang et al. | 343/722 |
| 2010/0176999 A1* | 7/2010 | Anguera et al. | 343/702 |
| 2011/0063042 A1* | 3/2011 | Mendolia et al. | 333/17.3 |
| 2012/0299795 A1* | 11/2012 | Wang | 343/850 |
| 2014/0132409 A1* | 5/2014 | Billman | G08B 19/00 340/539.1 |
| 2014/0191988 A1* | 7/2014 | Corrion | 345/173 |

FOREIGN PATENT DOCUMENTS

CN 202257621 5/2012

OTHER PUBLICATIONS

NFC Reader and Tag Antennas, http://www.taoglas.com/antennas/NFC_Reader_and_Tag_Antennas/ retrieved from the wed Aug. 21, 2012, copyright Taoglas 2012.

* cited by examiner

*Primary Examiner* — Trinh Dinh
(74) *Attorney, Agent, or Firm* — HP Inc Patent Department

(57) ABSTRACT

Examples disclose a printed circuit board including an antenna and a matching circuit to match an impedance of the antenna. Further, the examples of the printed circuit board provide the printed circuit board is interchangeable among various types of platforms by adjusting the impedance value of the matching circuit without replacing an electrical component of the matching circuit.

7 Claims, 5 Drawing Sheets

INTERCHANGEABLE PRINTED CIRCUIT BOARD AMONG VARIOUS TYPES OF PLATFORMS BY ADJUSTING AN IMPEDANCE VALUE

BACKGROUND

Government entities may mandate certifications in communication platforms, such as a near field communication platform, to certify that emissions are within certain guidelines. These certifications verify these platforms work properly and safely. However, the certifications are costly as communication components may vary from platform to platform and each platform may mandate certification.

BRIEF DESCRIPTION OF THE DRAWINGS

In the accompanying drawings, like numerals refer to like components or blocks. The following detailed description references the drawings, wherein.

DETAILED DESCRIPTION

Figure 1:
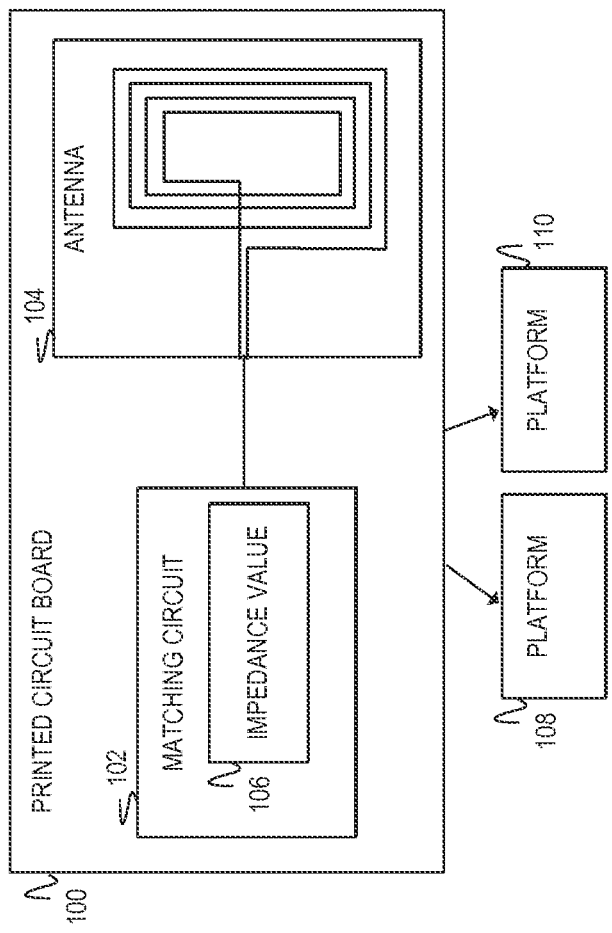
FIG. 1 is a block diagram of an example printed circuit board including an antenna and a matching circuit, the printed circuit board is interchangeable among various platforms by adjusting the impedance value.

Certifications of communication platforms, such as a near field communication platform, become costly as component design changes require certification in the platform which the changes are implemented. For example, antennas may be product-specific as the real estate dimensions and the frequency requirements may vary from platform to (platform. If placing the antenna into a different type of platform, then the electrical components associated with the antenna may have to be replaced to adjust the frequencies of the antenna at the different types of platforms. Replacing the electrical components associated with the antenna requires further testing and certification which increases resource costs.

To address these issues, example embodiments disclose a printed circuit board including an antenna and a matching circuit which matches an impedance value of the antenna based on a coupled platform. Matching the impedance value of the antenna minimizes power loss and data inconsistencies from a signal received on the antenna to a particular platform in which the antenna is implemented. Also, placing the antenna and the matching circuit onto a singular circuit board provides a unified type of circuit design for implementation across various types of platforms without the space and material constraints.

Additionally, the example embodiments provide the printed circuit board is interchangeable among various types of platforms through adjusting the impedance value of the matching circuit. Further, the impedance value is adjusted without replacing an electrical component of the matching circuit. Controlling the impedance value of the matching circuit enables the antenna to vary frequency levels for compatibility among various types of platforms. For example, the frequency for a wood type of platform may be different than the frequency for a metal type of platform. Adjusting the impedance value without replacing the electrical component, prevents certification at each type of platform as it eliminates the component design changes from platform to platform.

In another embodiment, the printed circuit board further includes a near field communication module partitioned from the antenna and the matching circuit. The near field communication module is interchangeable among the various types of platforms, thus eliminating additional certification as there are no electrical component design changes within the near field communication module. Further, the near field communication module creates a type of standard module for implementation among the various types of platforms as the individual electrical components may be adjusted by a control circuit. The impedance value may be adjusted when the printed circuit board is initially coupled to a platform, such as a computing device. In another example, the impedance value may be automatically adjusted as part of configuration process of the platform. Partitioning the near field communication module from the antenna and the matching circuit also provides flexibility in replacing the antenna, matching circuit, and/or near field communication module without replacing the entire printed circuit board.

In summary, example embodiments disclosed herein provide a unified antenna circuit design by adjusting the impedance value of the matching circuit without replacing electrical components, thus preventing certification at various types of platforms. Adjusting the impedance value enables the antenna to obtain various frequencies in each particular type of platform. Additionally, the example embodiments provide flexibility as individual circuits and/or modules may be replaced without replacing the entire circuit.

Referring now to the drawings, FIG. 1 is block diagram of example printed circuit board 100 including an antenna 104 and a matching circuit 102. The printed circuit board 100 is considered interchangeable among various types of platforms 108 and 110 by adjusting an impedance value 106 of the matching circuit 102. Additionally, the impedance value 106 of the matching circuit 102 is adjusted without replacing an electrical component within the matching circuit 102.

Figure 2:
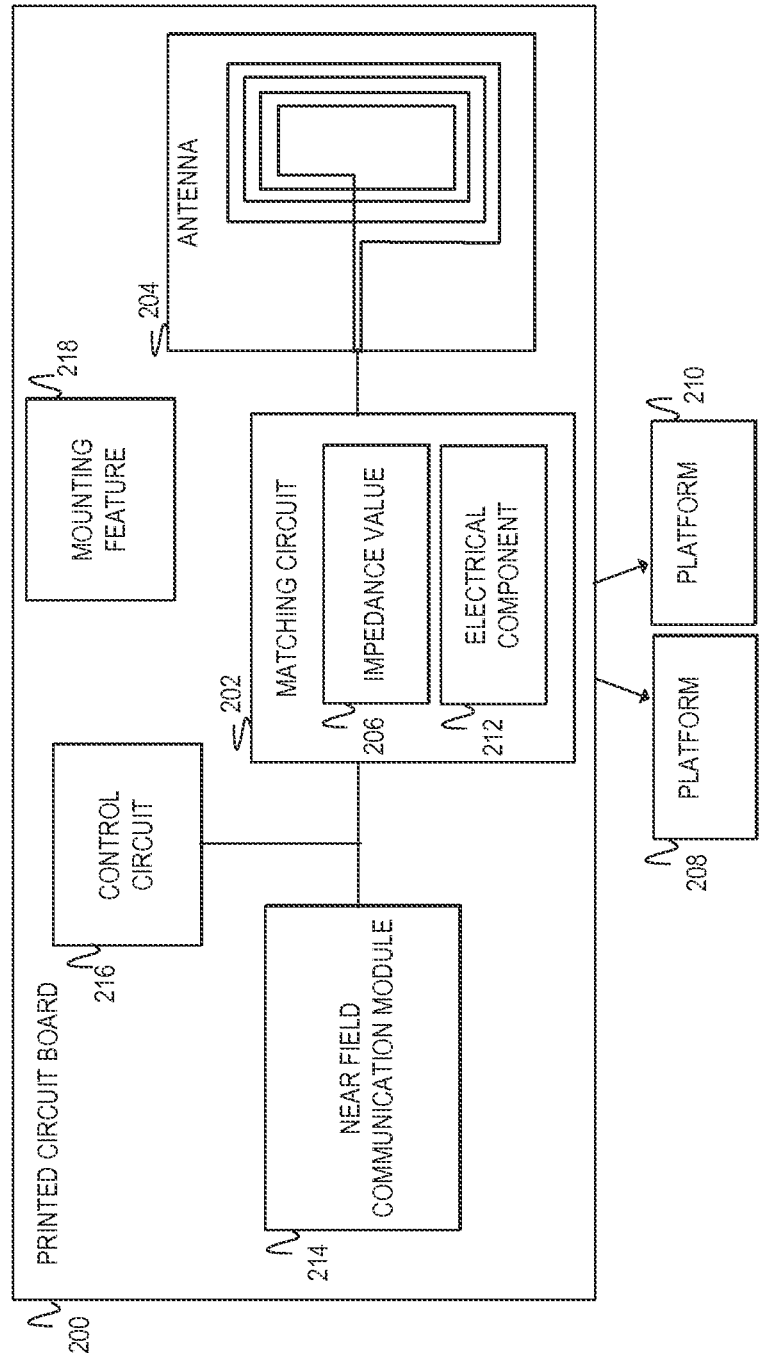
FIG. 2 is a block diagram of an example printed circuit board, including an antenna, matching circuit, near field communication module, mounting feature to affix the printed circuit board to a platform, and a control circuit to vary the impedance value of the matching circuit for interchangeability among the various platforms without replacing an electrical component.

The printed circuit board 100 is a mechanical support that uses conductive pathways between the antenna 104 and the matching circuit 102. Specifically, the printed circuit board 100 integrates the antenna 104 and the matching circuit 102 onto a module to provide a unified module for implementation among the various types of platforms 108 and/or 110. By providing a unified module for implementation into these platforms 108 and 110 the printed circuit board 100 provides interchangeability among the types of platforms 108 and 110 by adjusting the impedance value 106 of the matching circuit 102. Further, although FIG. 1 depicts the printed circuit board 100 as maintaining conductivity between the antenna 104 and the matching circuit 102, embodiments should not be limited to this example, as this was done for illustration purposes and not for limiting purposes. For example, the printed circuit board 100 may include a control circuit, near field communication module, and/or other electrical components as seen in FIG. 2. In another embodiment, the printed circuit board 100 may include a radio frequency (RF) front end circuitry between the antenna 104 and the matching circuit 102 for processing an incoming signal from the antenna 104. The RF front end circuitry may process the incoming signal for filtering, amplifying, and eliminating noise within the signal. Embodiments of the printed circuit board 100 includes an integrated circuit, circuit board, module, socket board, circuit, and/or other type of mechanical structure to support the antenna 104 and the matching circuit 102 as part of a communication system.

The antenna 104 is an electrical device which converts electrical power into radio waves (i.e., electromagnetic waves) and vice versa for transmitting and receiving data and/or power communication. In transmission, the antenna 104 transmits an oscillating radio frequency electric current at the antenna's 104 terminals as seen in the left of the antenna box 104 as in FIG. 1. The antenna 104 uses these terminals to radiate energy as electromagnetic waves. In receiving, the antenna 104 intercepts some power of the electromagnetic waves to produce voltage applied at its terminals and applied to the matching circuit 102. The antenna 104 performs optimally (i.e., with minimal losses) when the matching circuit 102 matches the impedance value 106 of the antenna 104. Matching the impedance value 106 to an impedance of the antenna 104 enables a tuning of the antenna 104 among the various types of platforms 108 and 110, as tuning of the antenna 104 is dependent on the type of platform 108 or 110 in which it is implemented. Mismatching of the impedance value 106 to the antenna 104 creates power losses and data communication inconsistencies between platforms. This further reduces the power of the signal when mismatching the impedance value 102 and the antenna 104. The various types of platforms 108 and/or 110 are each compatible with a different frequency level, as such the antenna 104 may be tuned to obtain the different frequency levels by adjusting the impedance value 106 of the matching circuit 102.

The matching circuit 102 matches the impedance value 106 to that of the antenna 104 so a maximum amount of power is transferred from the antenna 104. The impedance value 106 is adjusted to match the impedance of the antenna 104 without replacing an electrical component (not illustrated) of the matching circuit 102. As such, the matching circuit 102 may include variable electrical components which may be adjusted to various impedance values 106. In an embodiment, the matching circuit 102 includes a tuning circuit to tune to a particular frequency by adjusting the impedance value 106. The frequency levels vary for compatibility among the various types of platforms 108 and 110. Controlling the impedance value 106 of the matching circuit 102 enables the antenna 104 to vary the frequency levels for the various types of platforms 108 and 110. In this manner, the printed circuit board 100 thus provides an optimal frequency for a given type of platform 108 or 110. For example, the frequency level for compatibility with a mobile device may be different from the frequency level compatibility for a laptop. In another embodiment, the matching circuit 102 includes radio frequency (RE) component(s), which are used to control the impedance of the matching circuit 102 and thus in turn, controlling the frequency of the antenna 104. In another embodiment, the matching circuit 102 is included as part of the RF front end circuitry.

The impedance value 106 is the measure of the opposition created in the matching circuit 102 that presents the passage of current when the voltage is applied from the antenna's 104 terminals. The impedance value 106 is the complex ratio of voltage to current at the particular frequency, thus adjusting the impedance value 106 may modify the particular frequency. Additionally, the impedance value 106 may be adjusted without replacing an electrical component associated with the matching circuit 102. The impedance value 106 is adjusted to obtain a similar impedance of the antenna 104, so the maximum amount of power may be transferred. In another embodiment, a control circuit may modify the variable electrical components within the matching circuit 102 to achieve a particular impedance value 106. Controlling the impedance value 106 of the matching circuit 102 modifies the frequency levels for compatibility in one of the various types of platforms 108 and 110. Embodiments of the impedance value 106 include a resistance, inductance, capacitance, or other type of measurement of the opposition in the matching circuit 102.

The various types of platforms 108 and 110, each represent a different type and/or version of a computing device in which the printed circuit board 100 may be implemented for data and/or power communications. For example, the platform 108 may represent a mobile device, while platform 110 represents a personal computer. In another embodiment, each of the various types of platforms 108 and 110 represent a version of a computing device. For example, platform 108 may be a first version of the computing device, while platform 110 may be a second or subsequent version of the computing device. Each of the various types of platforms 108 and 110 may be manufactured out of different material and as such, each of these platforms 108 and 110 may be compatible for data and/or power communication through electromagnetic waves at different frequency levels. For example, platform 108 may be manufactured out of an alloy, plastic, and/or wood, thus for the electromagnetic waves to penetrate the material, the platform 108 may be compatible at a different frequency level than the frequency level for platform 110. In a further embodiment, the types of platforms 108 and 110 may include a tap zone, an area on the types of platforms 108 and 110 which is predefined for the platforms 108 and 110 to establish a communication link. The communication link is established by tapping the platforms 108 and 110 together at this area or brining the platforms 108 and 110 within close proximity between these areas. Yet, in a further embodiment, the platforms 108 and 110 may include a near field communication module to establish radio communication with each other by touching them together or bringing the platforms 108 and/or 110 within close proximity. These embodiments are discussed in detail in later figures. Embodiments of the various types of platforms 108 and 110 include a client device, communication device, personal computer, desktop computer, laptop, a mobile device, a tablet, or other type of device capable of implementing the printed circuit board 100 for communication among the platforms 108 and/or 110.

FIG. 2 is a block diagram of an example printed circuit board 200 including an antenna 204, matching circuit 202, near field communication module 214, and a mounting feature 218 to affix the printed circuit board 200 to one of the various platforms 208 and 210. Additionally, the printed circuit board 200 includes a control circuit 216 to vary an impedance value 206 of the matching circuit 202 without replacing an electrical component 212. Although FIG. 2 illustrates the near field communication module 214 and the control circuit 216 as part of the printed circuit board 200, embodiments should not be limited to this illustration as the near field communication module 214 and the control circuit 216 may be physically separated from the printed circuit board 200 as in FIG. 3. The printed circuit board 200, the matching circuit 202, the antenna 204, and the various types of platforms 208 and 210 may be similar in structure and functionality to the printed circuit board 100, the matching circuit 102, the antenna 104, and the various types of platforms 108 and 110 as in FIG. 1.

The impedance value 206 of the matching circuit 202 is adjusted by the control circuit 216 without replacing the electrical component 212. The impedance value 206 is the measurement of opposition in the matching circuit 202 and may be similar in structure and functionality to the impedance value 106 as in FIG. 1. To achieve the particular impedance value 206 to match the impedance of the antenna 204, the electrical component 212 of the matching circuit 202 may be adjusted and/or modified by the control circuit 216. In one embodiment, the electrical component 212 includes a variable electrical component which is adjusted to achieve the impedance value 206 to match the impedance of the antenna 204. In this embodiment, the electrical inductance measurement corresponding to at least one of the variable electrical components 212 is adjusted. Embodiments of the electrical component 212 include a capacitor, inductor, resistor, or other type of electrical component which may be adjusted for various impedance values.

The near field communication module 214 enables close range power coupling and/or close range data communication by establishing radio communication between computing devices. The near field communication module 214 establishes communication by touching the computing devices and/or bringing the computing devices within close proximity to one another. Additionally the near field communication module 214 processes the signal received from the matching circuit 202 and/or antenna 204 to convert into data for the given platform 208 or 210 system. The logic within this module 214 enables the signal to communicate by converting the electromagnetic waves (i.e., signals) received at particular frequencies to data for the particular platform 208 or 210 which implements the module 214. For example, the near field communication module 214 may receive an analog signal for conversion to a digital signal for the given type of platform 208 or 210. The near field communication module 214 is considered independent of the impedance value 206 of the antenna 204. In this manner, the near field communication module 214 provides a common module useable among the various types of devices 208 and 210. In another embodiment, the near field communication module 214 is partitioned from the matching circuit 202 and the antenna 204. Partitioning the near field communication module 214 from the antenna 204 and the matching circuit 202 provides a modularity of the printed circuit board 200. The modularity provides a flexibility of changing out the antenna 204, matching circuit 202, etc. without replacing the entire printed circuit board 200. Also, the modularity provides flexibility by changing the impedance level 206 without replacing the electrical component 212 to get optimal performance in near field communications across the various types of platforms 208 and 210. In a further embodiment, the near field communication module 214 is physically separated from the antenna 204 and the matching circuit 202 to further reduce the number of certifications for the various types of platforms 208 and 210. For example, by replacing and/or changing an electrical component within the near field communication module 214 may mandate certification in one of the platforms 208 or 210 for that newly implemented electrical component. Thus, by providing a unified near field communication module 214 interchangeable among the various types of platforms 208 and 210, the certifications may be reduced. Embodiments of the near field communication module 214 include a chipset, controller, logic, or other type of circuit module suitable for establishing close range power coupling and/or data communication.

The control circuit 216 includes logic to vary the impedance value 206 of the matching circuit 202 through transmitting signals to the electrical component 212. Specifically, the control circuit 2116 provides an intelligence to vary the impedance value 206 to match the impedance of the antenna 204. Varying the impedance value 206 enables a flexibility to change design parameters of the platform 208 or 210 through which the printed circuit board 200 is implemented. In another embodiment, the control circuit 216 adjusts the impedance value 206 of the matching circuit 202 to obtain a frequency for the particular platform 208 or 210 in which the printed circuit board 200 is implemented. In a further embodiment, the control circuit 216 may scan for interferences with the antenna 204 and modify the impedance value 206 to reduce this interference. Through varying the impedance value 206, the frequencies of the antenna 204 are varied for compatibility in the particular platform 208 or 210. Embodiments of the control circuit 216 include a process, controller, controlling unit, or other type of logic circuit capable to varying the impedance level 206 of the matching circuit 202.

The mounting feature 218 is utilized to affix the printed circuit board 200 to one of the platforms 208 or 210. The mounting feature 218 is a mechanical support used to place the printed circuit board 200 in one of various types of platforms 208 or 210. In another example, the mounting feature can be an adhesive or magnet. As such, embodiments of the mounting feature 218 may include a mechanical structure, chemical structure, or other type of support to affix the printed circuit board 200 to one of the platforms 208 or 210.

Figure 3:
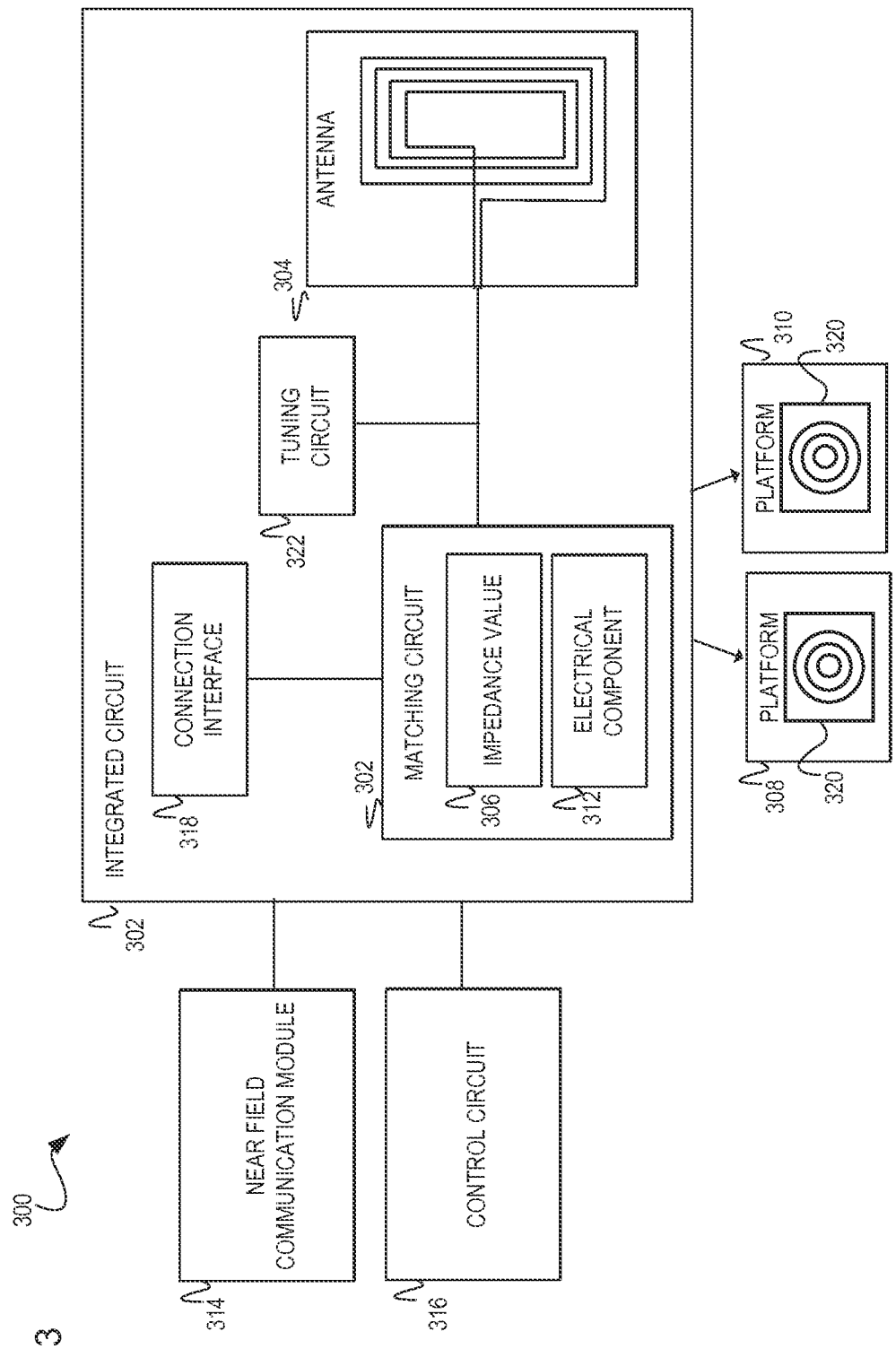
FIG. 3 is a block diagram of an example communication system including an integrated circuit for interchangeability among various platforms with an antenna, tuning circuit, and connection interface; the communication system also includes a near field communication module and a control circuit.

FIG. 3 is a block diagram of an example communication system 300 including an integrated circuit 302 for interchangeability among various types of platforms 308 and 310 with an antenna 304, matching circuit 302, connection interface 318, and a tuning circuit 322. The communication system 300 also includes a near field communication module 314 and a control circuit 316. Additionally, the various types of platforms 308 and 310 include tap zones 320 to establish close range radio communication. The communication system 300 enables close range power coupling and/or data communication among platforms 308 and 310.

The integrated circuit 302, the matching circuit 302, the antenna 304, the impedance value 306, the electrical component 312, and the various types of platforms 308 and 310 may be similar in structure and functionality to the printed circuit board 100 and 200, the matching circuit 102 and 202, the antenna 104 and 204, the impedance value 106 and 206, the electrical component 212, and the various types of platforms 108, 110, 208, and 210 as in FIGS. 1-2.

The connection interface 318 is an interface which carries communications on a bus between the particular platform 308 or 310 and the integrated circuit 302. In another embodiment, the near field communication module 314 is integrated on the integrated circuit 302 and as such, the connection interface 318 carries communications between the module 314 and the particular platform 308 or 310. Embodiments of the connection interface 318 include a uni-directional bus, bi-directional bus, small computer system interface, parallel interface, serial interface, or other type of interface capable of carrying communications between components.

The tap zones 320 are pre-defined areas on the various platforms 308 and 310 to establish a close range communication link between platforms 308 and 310. The tap zones 320 are pre-defined areas on the platforms 308 and 310 to communicate by tapping together these areas between the platforms 308 and 310 and/or bringing the platforms 308 and 310 within close proximity at these areas. These areas 320 are pre-defined according to the particular platform 308 or 310 and/or near field communication standards. Additionally, the close proximity is the distance between the platforms 308 and 310 which is usually no more than a few centimeters.

The tuning circuit 322 obtains a frequency level for a particular platform 308 or 310 in which the integrated circuit 302 is implemented through an adjustment of the impedance value 306 of the matching circuit 302 without replacing the electrical component 312. The circuit 322 is connected between the antenna 302 and a transmitter and/or receiver which allows the antenna 304 to obtain various frequencies. Specifically, the tuning circuit 322 may generate or receive a signal at a particular frequency for transmission and receiving through the antenna 304 to and from other platforms. In this manner, the tuning circuit 322 may be used to vary the frequencies on the antenna 304 for compatibility of the integrated circuit 302 in the various types of platforms 308 and/or 310. The antenna 304 with the matching circuit 302 becomes more efficient by incorporating the tuning circuit 322 as the antenna 304 may resonate in frequencies due to multiple reflections which may create losses.

Figure 4:
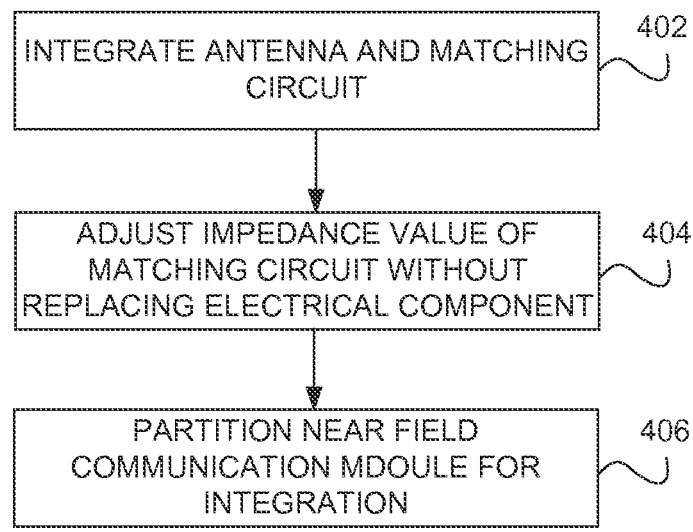
FIG. 4 is a flowchart of an example method performed by a computing device to integrate an antenna and a matching circuit on a circuit board, adjust the impedance value of the matching circuit without replacing an electrical component, and partition a near field communication module for integration on the circuit board.

FIG. 4 is a flowchart of an example method performed on a computing device to integrate an antenna and matching circuit onto a circuit board, adjust an impedance value of the matching circuit without replacing an electrical component, and partition a near field communication module for integration on the circuit board. In discussing FIG. 4, reference may be made to FIGS. 1-3 to provide contextual examples. Further, although FIG. 4 is described as implemented on computing devices such platforms 108, 110, 208, 210, 308, and 310, it may be executed on other suitable components. For example, FIG. 4 may be implemented on a computer-readable storage medium.

At operation 402 the antenna and the matching circuit are integrated on the circuit board. In one embodiment, operation 402 occurs at the manufacturing level, creating a standard type of antenna communication system that may be implemented in different types of devices by adjusting the impedance value of the matching circuit at operation 404. Antennas operate to transmit and receive various electrical magnetic waves for communication and/or power and are dependent on each type of platform. The matching circuit is used for generating signals for the antenna to emit at a particular frequency or receives the signal from the antenna at a particular frequency through adjusting the impedance level of the matching circuit. By adjusting the impedance value of the matching circuit at operation 404, the particular frequency may be achieved to receive or emit signal by the antenna.

At operation 404 the impedance value of the matching circuit is adjusted without replacing an electrical component of the matching circuit. In one embodiment, the matching circuit includes at least one variable electrical component and as such, this variable component may adjust to varying impedances. In another embodiment, operation 404 includes replacing the antenna that was integrated at operation 402. In this embodiment, the impedance value of the matching circuit is re-adjusted without replacing an electrical component to match to the impedance of the implemented antenna. This further allows the antenna to be dependent on the various platforms and by adjusting the impedance value of the matching circuit, prevents recertification for each of the different types of platforms. This also further allows the frequency levels to change based on particular platform in which the circuit board is implemented.

At operation 406 the near field communication module is partitioned from the antenna and the matching circuit for integration onto the circuit board. The near field communication module includes the logic components which receives the signal as through the antenna and communicates the signal to the platform. In one embodiment, the near field communication module converts the analog signal to a digital data for the platform.

Figure 5:
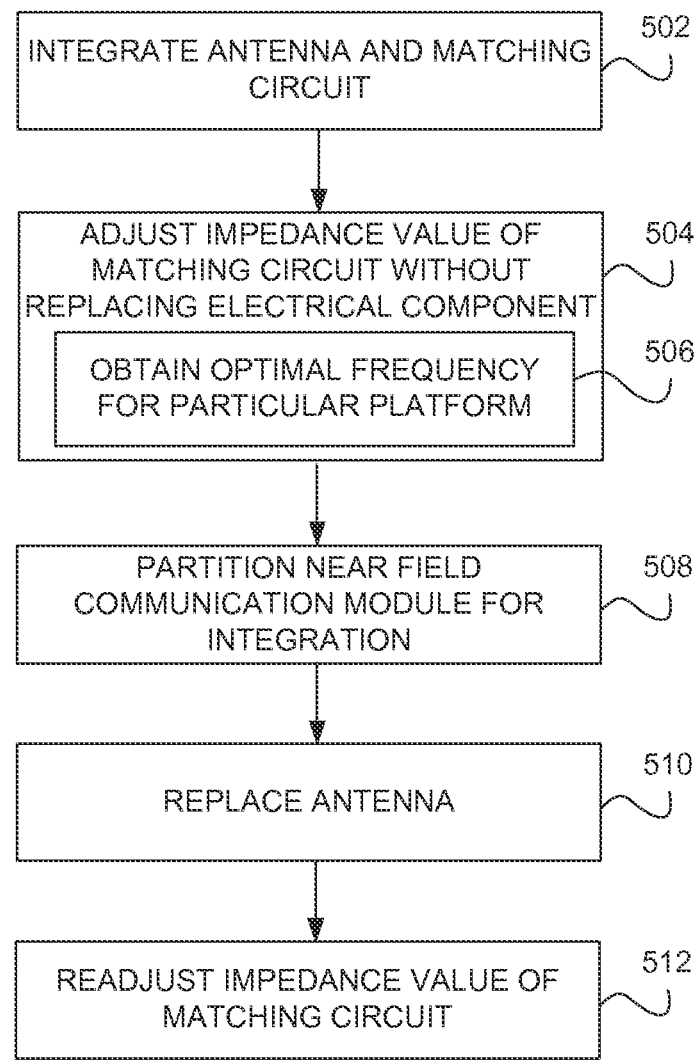
FIG. 5 is a flowchart of an example method performed by a computing device to integrate an antenna and matching circuit on a circuit board, adjust an impedance value of the matching circuit, partition a near field communication module also for integration on the circuit board, replace the antenna on the circuit board, and readjust an impedance value of the matching circuit.

FIG. 5 is a flowchart of an example method performed by a computing device to integrate an antenna and matching circuit on a circuit board, adjust an impedance value of the matching circuit, partition a near field communication module also for integration on the circuit board, replace the antenna on the circuit board, and readjust an impedance value of the matching circuit. In discussing FIG. 5, reference may be made to FIGS. 1-3 to provide contextual examples. Further, although FIG. 5 is described as implemented on computing devices such platforms 108, 110, 208, 210, 308, and 310, it may be executed on other suitable components. For example, FIG. 5 may be implemented on a computer-readable storage medium.

At operations 502-504 the antenna and matching circuit are integrated on the circuit board and the impedance value of the matching circuit is adjusted without replacing an electrical component. Additionally, operation 504 may include tuning to an optimal frequency for a particular platform as in operation 506. Operations 502-504 may be similar in functionality to operation 402 as in FIG. 4.

At operation 506, an optimal frequency is obtained for the particular platform. In operation 506, the matching circuit varies frequencies as the impedance value is adjusted at operation 504. In this manner, operation 506 the matching circuit varies frequencies for compatibility among the various types of platforms. Controlling and/or adjusting the impedance value of the matching circuit, adjusts the frequency for each type of platform, thus optimizing the frequency for that particular platform.

At operation 508 the near field communication module is partitioned for integration onto the circuit board with the antenna and the matching circuit as in operation 504. Additionally, the near field communication module communication module is interchangeable among the various types of platforms. Operation 508 may be similar in functionality to operation 406 as in FIG. 4.

At operation 510 the antenna as integrated onto the circuit at operation 502 may be replaced. The antenna may be platform specific, and as such, may change from platform to platform due to space restrictions or other type of design parameters. Changing the antenna while keeping the matching circuit enables components to be replaced on the printed circuit board without replacing electrical components within the matching circuit which may require additional certification.

At operation 512 the impedance value of the matching circuit is readjusted without replacing the electrical component of the matching circuit in one embodiment, a control circuit such as control circuit 216 and/or 316 may readjust the impedance value of the matching circuit. Readjusting the impedance value of the matching circuit, enables design parameters of the antenna and/or platforms to change, without replacing the electrical component within the matching circuit, thus eliminating certification from platform to platform and providing interchangeability among the various types platforms.

In summary, example embodiments disclosed herein provide a unified antenna circuit design by adjusting the impedance value of the matching circuit without replacing electrical components, thus preventing certification at various types of platforms. Adjusting the impedance value enables the antenna to obtain various frequencies in each particular type of platform. Additionally, the example embodiments provide flexibility as individual circuits and/or modules may be replaced without replacing the entire circuit.

We claim:

1. A communication system comprising:
    an integrated circuit including:
        an antenna;
        a matching circuit to adjust to an impedance value of the antenna;
        a tap zone to establish close range communication between a particular platform and a second platform, the particular platform being operable at a different frequency level from the second platform, the tap zone including a pre-defined area on the particular platform; and
        a control circuit to tune the antenna for a compatible frequency level for the close range communication between the particular platform and the second platform, by adjusting an impedance value of the matching circuit when the particular platform and the second platform are within close proximity to each other to establish the close range communication.

2. The communication system of claim 1, further comprising:
    a near field communication module to convert a signal received by the antenna to a data signal for the particular platform in which the communication system is implemented, the near field communication module being interchangeable among various types of platforms, including the particular platform and the second platform.

3. The communication system of claim 2, further comprising:
    a connection interface to transmit communications between the particular platform and the near field communication module.

4. The communication system of claim 1, wherein the electrical component of the matching circuit comprises a variable electrical component, and wherein the control circuit adjusts the impedance value of the variable electrical component.

5. The communication system of claim 4, wherein the variable electrical component is one of a resistor, an inductor, or a capacitor.

6. The communication system of claim 1, wherein the antenna is replaceable without replacing an electrical component of the matching circuit.

7. The communication system of claim 1, wherein the particular platform is manufactured from one of a wood material, an alloy material, or a plastic material.

* * * * *

UNITED STATES PATENT AND TRADEMARK OFFICE
CERTIFICATE OF CORRECTION

| | | |
|---|---|---|
| PATENT NO. | : 9,293,824 B2 | Page 1 of 1 |
| APPLICATION NO. | : 13/689698 | |
| DATED | : March 22, 2016 | |
| INVENTOR(S) | : Anand et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 528 days.

Signed and Sealed this
Twenty-first Day of June, 2016

Michelle K. Lee
*Director of the United States Patent and Trademark Office*